United States Patent
Lee et al.

(10) Patent No.: US 10,626,245 B2
(45) Date of Patent: Apr. 21, 2020

(54) ADHESIVE FILM AND SEALING PRODUCT FOR ORGANIC ELECTRONIC DEVICE USING SAME

(71) Applicant: LG CHEM, LTD., Seoul (KR)

(72) Inventors: Seung Min Lee, Daejeon (KR); Suk Ky Chang, Daejeon (KR); Hyun Jee Yoo, Daejeon (KR); Jung Sup Shim, Daejeon (KR); Yoon Gyung Cho, Daejeon (KR); Kyung Yul Bae, Daejeon (KR)

(73) Assignee: LG Chem, Ltd., Seoul (KR)

(*) Notice: Subject to any disclaimer, the term of this patent is extended or adjusted under 35 U.S.C. 154(b) by 0 days.

(21) Appl. No.: 16/119,740

(22) Filed: Aug. 31, 2018

(65) Prior Publication Data

US 2019/0071553 A1 Mar. 7, 2019

Related U.S. Application Data

(63) Continuation of application No. 14/527,182, filed on Oct. 29, 2014, now Pat. No. 10,093,785, which is a continuation of application No. PCT/KR2013/007054, filed on Aug. 5, 2013.

(30) Foreign Application Priority Data

Aug. 3, 2012 (KR) .................. 10-2012-0085427
Aug. 5, 2013 (KR) .................. 10-2013-0092549

(51) Int. Cl.
| | | |
|---|---|---|
| H01L 21/56 | (2006.01) | |
| C08K 3/22 | (2006.01) | |
| C09J 163/00 | (2006.01) | |
| C08G 59/50 | (2006.01) | |
| C08L 63/00 | (2006.01) | |
| H01L 51/52 | (2006.01) | |
| C08K 3/01 | (2018.01) | |

(52) U.S. Cl.
CPC ............ *C08K 3/22* (2013.01); *C08G 59/5073* (2013.01); *C08L 63/00* (2013.01); *C09J 163/00* (2013.01); *C08G 2650/56* (2013.01); *C08K 3/01* (2018.01); *C08K 2003/2206* (2013.01); *H01L 21/563* (2013.01); *H01L 51/5246* (2013.01); *H01L 51/5259* (2013.01)

(58) Field of Classification Search
CPC .............. H01L 51/5246; H01L 51/5259; H01L 21/563
See application file for complete search history.

(56) References Cited

U.S. PATENT DOCUMENTS

| | | | |
|---|---|---|---|
| 2005/0062174 A1 | 3/2005 | Ingle | |
| 2012/0313499 A1 | 12/2012 | Son et al. | |
| 2012/0326194 A1 | 12/2012 | Son et al. | |
| 2013/0240862 A1 | 9/2013 | Yoo et al. | |
| 2013/0248110 A1 | 9/2013 | Lee et al. | |
| 2013/0251989 A1 | 9/2013 | Yoo et al. | |
| 2014/0217621 A1 | 8/2014 | Yoo et al. | |
| 2015/0062524 A1 | 3/2015 | Kim et al. | |
| 2015/0069376 A1 | 3/2015 | Son et al. | |
| 2018/0204741 A1* | 7/2018 | Chew | ............... H01L 24/97 |

FOREIGN PATENT DOCUMENTS

| | | |
|---|---|---|
| CN | 101787099 A | 7/2010 |
| JP | 10-025334 A | 1/1998 |
| JP | 2002-260847 A | 9/2002 |
| JP | 2007-149748 A | 6/2007 |
| JP | 2007-154003 A | 6/2007 |
| KR | 10-2005-01011068 A | 10/2005 |
| KR | 10-0827535 B1 | 4/2008 |
| KR | 10-2010-075213 A | 7/2010 |
| KR | 10-2012-0046704 A1 | 5/2012 |
| KR | 10-2012-0055487 A | 5/2012 |
| TW | 201231605 A | 8/2012 |
| WO | 2012/060621 A2 | 5/2012 |

\* cited by examiner

*Primary Examiner* — George R Fourson, III
(74) *Attorney, Agent, or Firm* — Dentons US LLP

(57) ABSTRACT

Provided are an adhesive film, and an organic electronic device (OED) encapsulation product using the same. Dimensional stability, lifespan, and durability may be enhanced even when a panel of an organic electronic device is large-sized and formed as a thin film by controlling dimensional tolerance and edge angular tolerance of the adhesive film, thereby ensuring long-term reliability, and process yields may be enhanced when the adhesive film is applied to an automation process.

23 Claims, No Drawings

ADHESIVE FILM AND SEALING PRODUCT FOR ORGANIC ELECTRONIC DEVICE USING SAME

This application is a Continuation of U.S. application Ser. No. 14/527,182, filed Oct. 29, 2014, which is a Continuation Bypass of International Application No. PCT/KR2013/007054, filed on Aug. 5, 2013, and claims priority to Korean Application Nos. 10-2012-0085427, filed on Aug. 3, 2012 and 10-2013-0092549, filed on Aug. 5, 2013, all of which are hereby incorporated by reference in their entireties as if fully set forth herein.

1. FIELD OF THE INVENTION

The present invention relates to an adhesive film and an encapsulation product of an organic electronic device (OED) using the same.

2. DISCUSSION OF RELATED ART

An organic electronic device refers to a device including an organic material layer generating exchange of charges using holes and electrons, and may include a photovoltaic device, a rectifier, a transmitter, and an organic light emitting diode (OLED).

An organic light emitting diode, which is a representative organic electronic device, consumes less power and has a higher response speed than conventional light sources, and is preferable as a thin display device or light. In addition, the organic light emitting diode has excellent space utilization, and thus is expected to be applied in various fields including all kinds of portable devices, monitors, notebook computers, and TVs.

To expand compatibility and use of the organic light emitting diode, the most important problem is durability. Organic materials and metal electrodes included in the organic light emitting diode are very easily oxidized by external factors such as moisture, and a product including the organic light emitting diode is very sensitive to environmental factors. Therefore, there are demands for developing encapsulants which can effectively prevent permeation of moisture, reduce damages to the organic electronic device, and ensure long-term reliability.

SUMMARY OF THE INVENTION

The present invention is directed to providing an adhesive film and an organic electronic device encapsulation product using the same.

In one aspect, the present invention provides an adhesive film encapsulating an organic electronic device including a curable adhesive layer including a curable resin, and a dimensional tolerance (d) or edge angular tolerance (x) of the adhesive film satisfies Equation 1 or 2.

$$d = |d_f - d_i| < 800 \ \mu m$$

$$x = |x_f - x_i| < 0.05 \text{ degrees} \quad \text{[Equation 1]}$$

Here, $d_i$ is a length of a longer side or shorter side of the adhesive film at an optional i point, and $d_f$ is a length of a longer side or shorter side of the adhesive film at a point of 2 weeks or more after the optional i point.

In another aspect, the present invention provides an encapsulation product of an organic electronic device, which includes a substrate; an organic electronic device formed on the substrate; and the adhesive film encapsulating the organic electronic device that covers an entire surface of the organic electronic device.

Effect

Adhesive films according to exemplary embodiments of the present invention can have enhanced dimensional stability, lifespan, and durability even when a panel of an organic electronic device is large-sized and formed as a thin film by controlling dimensional tolerance and edge angular tolerance of the adhesive film, thereby ensuring long-term reliability, and have enhanced process yields when applied to an automation process.

DETAILED DESCRIPTION OF EXEMPLARY EMBODIMENTS

Hereinafter, exemplary embodiments of the present invention will be described in further detail. In addition, to describe the present invention, detailed descriptions of related known conventional functions or components will be omitted.

The term "organic electronic device (OED)" refers to a material or device having a structure including an organic material layer generating exchange of charges using holes and electrons between a pair of electrodes facing each other, which may be, for example, a photovoltaic device, a rectifier, a transmitter, and an organic light emitting diode, but the present invention is not limited thereto. In one example of the present invention, the organic electronic device may be an organic light emitting diode.

In the specification, the curable adhesive may be an adhesive that can be maintained in a solid or semi-solid state at room temperature, attach a planar plate without bubbles due to flowability when heat is applied, and firmly fix a target with the adhesive when a curing reaction is terminated.

The adhesive film according to an exemplary embodiment of the present invention encapsulates an organic electronic device, the adhesive film includes a curable adhesive layer including a curable resin, and a dimensional tolerance (d) or edge angular tolerance (x) of the adhesive film satisfies Equation 1 or 2.

$$d = |d_f - d_i| < 800 \ \mu m$$

$$x = |x_f - x_i| < 0.05 \text{ degrees} \quad \text{[Equation 1]}$$

Here, $d_i$ is a length of a longer side or shorter side of the adhesive film at an optional i point, and $d_f$ is a length of a longer side or shorter side of the adhesive film at a point of 2 weeks or more after the optional i point.

In the specification, the optional i point refers to an optional point within two hours after the adhesive film is manufactured.

It is important that the adhesive film ensures long-term reliability to increase process yields when applied to an automation process in encapsulation of the organic electronic device. To ensure the long-term reliability, the dimensional tolerance and edge angular tolerance of the adhesive film may be controlled, and in order to do this, the adhesive film according to exemplary embodiments of the present invention may be stored at −10 to 10° C., −5 to 10° C., 0 to 10° C., or 2 to 5° C.

The dimensional tolerance of the adhesive film refers to a difference between a dimension of the film at an optional i point before storage in a refrigerator and a dimension of the film after storage in a refrigerator, and the dimension refers to a length of a longer side (horizontal side) or a shorter side (vertical side) of the adhesive film, and the tolerances of the respective dimensions are within a range of less than ±800 μm.

The edge angular tolerance of the adhesive film refers to change between an angle of an edge of the film at an optional i point before storage in a refrigerator and an angle of an edge of the film after storage in a refrigerator. An edge angle of an ideal adhesive film may be 90 degrees, altered by a wooden pattern to cut the adhesive film, and changed according to storage. However, to be applied to an automated encapsulation process for an organic electronic device, an angular tolerance of each edge of the adhesive film is less than ±0.05 degrees, and preferably less than ±0.03 degrees. It is preferable that all edges necessarily have an angular tolerance as described above.

The dimensional tolerance and angular tolerance of each edge of the adhesive film is necessary to be applied to a process regardless of the dimension of the adhesive film. However, recently, for a large-sized organic electronic device, a minimum size of the adhesive film may be 15 inches.

When the dimensional tolerance and angular tolerance of the adhesive film is controlled within the above range, defects of the product caused by dimensional change may be reduced, the lifespan of the organic electronic device may be maintained longer, and durability may be enhanced.

The adhesive film may have a viscosity at room temperature of $10^6$ or $10^7$ dyne/cm$^2$ or more. The term "room temperature" used herein may refer to a temperature, which is neither increased nor decreased, for example, approximately 15 to 35° C., particularly, approximately 20 to 25° C., and more particularly, approximately 25° C. The viscosity may be measured using an advanced rheometric expansion system (ARES). When the viscosity of the curable adhesive is controlled within the above range, high processability in the process of encapsulating the organic electronic device can be obtained, and a planar plane can be encapsulated to a uniform thickness. In addition, unlike a liquid adhesive, the curable adhesive can prevent physical or chemical damage to the organic electronic device by drastically reducing problems of contraction and generation of a volatile gas which may occur due to curing of a resin. In the present invention, as long as the adhesive is maintained in a solid or semi-solid state at room temperature, the upper limit of the viscosity is not particularly limited, and for example, in consideration of the processability, the viscosity may be controlled within the range of approximately $10^9$ dyne/cm$^2$ or less.

In addition, since the adhesive film has the moisture resistance, and structurally allows the substrate to be adhered to an upper substrate, a manufacturing process is easily performed in the manufacture of a panel of the organic electronic device, the manufacturing process is simple since a separate passivation process can be omitted, and an encapsulation thickness of the organic electronic device is reduced to contribute to formation of a thin panel.

In exemplary embodiments of the present invention, a curable resin that can be used may have a water vapor transmission rate (WVTR) in a cured state of 50 g/m$^2$·day or less, and preferably, 30 g/m$^2$·day, 20 g/m$^2$·day, or 15 g/m$^2$·day or less. The term "cured state of a curable resin" refers to a state converted into a state in which the curable resin has constant components of the moisture absorbent and filler, and serves as a structural adhesive when the curable resin is cured or crosslinked by being used alone or by reacting with other components such as a curing agent and then applied to an encapsulant. The WVTR may be measured in a thickness direction of the cured product at 38° C. and relative humidity of 100% after the curable resin is cured and the cured product is formed in a film having a thickness of 80 μm. In addition, the WVTR may be measured according to ASTM F1249.

When the WVTR is controlled within the above range, the permeation of moisture, vapor, or oxygen into an organic electronic device encapsulation product may be effectively inhibited, and an effect of introducing a moisture reactive absorbent may be exhibited.

In one exemplary embodiment of the present invention, as the WVTR in the cured state of the resin is decreased, the encapsulation structure has a better performance. The lower limit of the WVTR is not particularly limited.

A specific kind of curable resin that can be used in the present invention is not particularly limited, and for example, may include various heat-curable or photocurable resins, which are known in the art. The term "heat-curable resin" refers to a resin that can be cured through suitable application of heat or aging, and the term "photocurable resin" refers to a resin that can be cured by the radiation of electromagnetic waves. In addition, in the category of the electromagnetic waves, microwaves, IR rays, UV rays, X rays, and γ rays, and particle beams such as α-particle beams, proton beams, neutron beams, and electron beams may be included. As an example of the photocurable resin, a cationic photocurable resin may be used. The cationic photocurable resin refers to a resin that can be cured by cationic polymerization or cationic curing induced by the radiation of electromagnetic waves. In addition, the curable resin may be a dual-curable resin including both of heat-curing and photocuring characteristics.

A specific kind of the curable resin is not particularly limited, as long as the curable resin has the above-described characteristics. For example, the curable resin may be a resin that can be cured to exhibit adhesive characteristics, which includes a resin including at least one heat-curable functional group such as a glycidyl group, an isocyanate group, a hydroxyl group, a carboxyl group, or an amide group, or at least one functional group that can be cured by the radiation of electromagnetic waves such as an epoxide group, a cyclic ether group, a sulfide group, an acetal group, or a lactone group. In addition, a specific kind of the resin may include an acryl resin, a polyester resin, an isocyanate resin, or an epoxy resin, but the present invention is not limited thereto.

As the curable resin, an aromatic or aliphatic, and linear or branched epoxy resin may be used. In one exemplary embodiment of the present invention, an epoxy resin containing at least two functional groups and having an epoxy equivalent of 180 to 1,000 g/eq may be used. As the epoxy resin having the above epoxy equivalent is used, characteristics such as adhesive performance and a glass transition temperature of the cured product may be effectively maintained. Such an epoxy resin may be one or a mixture of at least two of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenol methane-type epoxy resin, an alkyl-modified triphenol methane epoxy resin, a naphthalene-type epoxy resin, a dicyclopentadiene-type epoxy resin, and a dicyclopentadiene-modified phenol-type epoxy resin.

In the present invention, as an example, an epoxy resin including a cyclic structure in a molecular structure, and particularly, an epoxy resin including an aromatic group (e.g., a phenyl group), may be used. When the epoxy resin includes an aromatic group, a cured product may have excellent thermal and chemical stabilities and low WVTR, thereby enhancing reliability of the organic electronic device encapsulation structure. A specific example of the aromatic group-containing epoxy resin that can be used in the present invention may be, but is not limited to, one or a mixture of at least two of a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, a xyloc-based epoxy resin, a multifunctional epoxy resin, a phenol novolac epoxy resin, a triphenolmethane-type epoxy resin, and an alkyl-modified triphenolmethane epoxy resin.

As the epoxy resin, a silane-modified epoxy resin, for example, a silane-modified epoxy resin having an aromatic group may be used.

As the silane-modified epoxy resin, for example, a reaction product of at least one of the epoxy resins described above and a silane compound may be used. Here, the silane compound may be, for example, a compound represented by Formula 1.

$$D_n SiX_{(4-n)} \quad \text{[Formula 1]}$$

In Formula 1, D is a vinyl group, an epoxy group, an amino group, an acryl group, a methacryl group, a mercapto group, an alkoxy group, or an isocyanate group, or an alkyl group substituted with at least one of the functional groups described above, X is hydrogen, an alkyl group, a halogen, an alkoxy group, an aryl group, an aryloxy group, an acyloxy group, an alkylthio group, or an alkyleneoxythio group, and n is a number of 1 to 3.

In the compound of Formula 1, the functional group "D" may react with a functional group included in an epoxy resin, thereby forming a silane-modified epoxy resin.

For example, when the functional group is an amino group, the amino group may react with an epoxy group of the epoxy resin, thereby forming a "—CH(OH)—CH$_2$—NH—" bond, and thus the silane compound may be introduced into the epoxy group.

In addition, when the functional group "D" is an isocyanate group or an alkoxy group, a silane compound may be introduced by reacting the functional group "D" with an epoxy resin including a hydroxyl (OH) group, for example, a bisphenol-type epoxy resin such as a bisphenol F-type epoxy resin, a bisphenol F-type novolac epoxy resin, a bisphenol A-type epoxy resin, or a bisphenol A-type novolac epoxy resin.

In Formula 1, as the alkyl group, an alkyl group having 1 to 20 carbon atoms, 1 to 16 carbon atoms, 1 to 12 carbon atoms, 1 to 8 carbon atoms, or 1 to 4 carbon atoms may be used. The alkyl group may be a linear, branched, or cyclic alkyl group.

In Formula 1, as the halogen atom, fluorine (F), chlorine (Cl), bromine (Br), or iodine (I) may be used.

In addition, in Formula 1, as the alkoxy group, an alkoxy group having 1 to 20 carbon atoms, 1 to 12 carbon atoms, 1 to 8 carbon atoms, or 1 to 4 carbon atoms may be used. The alkoxy group may be a linear, branched, or cyclic alkoxy group.

In addition, in Formula 1, the aryl group or the aryl group included in the aryloxy group may include a so-called aralkyl group or arylalkyl group as well as the aryl group. For example, the aryl group may refer to a monovalent residue derived from a compound including at least one benzene ring or a structure in which at least two benzene rings are linked or condensed, or a derivative thereof. The aryl group may be, for example, an aryl group having 6 to 25, 6 to 21, 6 to 18, or 6 to 12 carbon atoms. The aryl group may be, for example, a phenyl group, a dichlorophenyl group, a chlorophenyl group, a phenylethyl group, a phenylpropyl group, a benzyl group, a tolyl group, a xylyl group, or a naphthyl group, and preferably, a phenyl group.

In addition, in Formula 1, the acyloxy group may be an acyloxy group having 1 to 20 carbon atoms, 1 to 16 carbon atoms, or 1 to 12 carbon atoms.

In addition, in Formula 1, the alkylthio group may be an alkylthio group having 1 to 20 carbon atoms, 1 to 16 carbon atoms, 1 to 12 carbon atoms, 1 to 8 carbon atoms, or 1 to 4 carbon atoms, and the alkyleneoxythio group may be an alkyleneoxythio group having 1 to 20 carbon atoms, 1 to 16 carbon atoms, 1 to 12 carbon atoms, 1 to 8 carbon atoms, or 1 to 4 carbon atoms.

The alkyl group, the alkoxy group, the aryl group, the acyloxy group, the alkylthio group, or the alkyleneoxythio group may be optionally substituted with at least one substituent. As the substituent, a hydroxyl group, an epoxy group, an alkyl group, an alkenyl group, an alkynyl group, an alkoxy group, an acyl group, a thiol group, an acryloyl group, a methacryloyl group, an aryl group, or an isocyanate group may be used, but the present invention is not limited thereto.

In Formula 1, the functional group "D" may be, for example, an alkoxy group, an amino group, or an isocyanate group among the above-described functional groups.

In addition, in Formula 1, the functional group "X" may be, for example, at least one, two or more, or three halogen atoms, alkoxy groups, aryloxy groups, acyloxy groups, alkylthio groups, or alkyleneoxythio groups, and preferably alkoxy groups.

The silane-modified epoxy resin may be, for example, an epoxy resin to which a silane compound is introduced in an amount of approximately 0.1 to 10 parts by weight, 0.1 to 9 parts by weight, 0.1 to 8 parts by weight, 0.1 to 7 parts by weight, 0.1 to 6 parts by weight, 0.1 to 5 parts by weight, 0.1 to 4 parts by weight, 0.1 to 3 parts by weight, 0.3 to 2 parts by weight, or 0.5 to 2 parts by weight relative to 100 parts by weight of the epoxy resin. In one example, the epoxy resin into which the silane compound is introduced may be an aromatic epoxy resin. The aromatic epoxy resin may be, for example, a bisphenol-type epoxy resin such as a bisphenol F-type epoxy resin, a bisphenol F-type novolac epoxy resin, a bisphenol A-type epoxy resin, or a bisphenol A-type novolac epoxy resin.

As described above, when the epoxy resin structurally having a silane group by being modified with a silane is used, adhesiveness of the organic electronic device to a glass substrate or an inorganic substrate material is maximized, and a moisture barrier ability or durability and reliability may also be enhanced. A specific kind of the epoxy resin is not particularly limited, and the resin may be easily obtained from, for example, a manufacturer such as Kukdo Chemical Co., Ltd.

In the present invention, the curable resin may also be a styrene-based resin, a polyolefin-based resin, a thermoplastic elastomer, a polyoxyalkylene-based resin, a polyester-based resin, a polyvinyl chloride-based resin, a polycarbonate-based resin, a polyphenylenesulfide-based resin, a mixture of hydrocarbon, a polyamide-based resin, an acrylate-based resin, an epoxy-based resin, a silicon-based resin, a fluorine-based resin, or a mixture thereof.

Here, as the styrene-based resin, for example, a styrene-ethylene-butadiene-styrene block copolymer (SEBS), a styrene-isoprene-styrene block copolymer (SIS), an acrylonitrile-butadiene-styrene block copolymer (ABS), an acrylonitrile-styrene-acrylate block copolymer (ASA), a styrene-butadiene-styrene block copolymer (SBS), a styrene-based homopolymer, or a mixture thereof may be used. As the olefin-based resin, for example, a high density polyethylene-based resin, a low density polyethylene-based resin, a polypropylene-based resin, or a mixture thereof may be used. The thermoplastic elastomer may be, for example, an ester-based thermoplastic elastomer, an olefin-based thermoplastic elastomer, or a mixture thereof. Among these, a polybutadiene resin or a polyisobutene resin may be used as the olefin-based thermoplastic elastomer. As the polyoxyalkylene-based resin, for example, a polyoxymethylene-based resin, a polyoxyethylene-based resin, or a mixture thereof may be used. As the polyester-based resin, for example, a polyethylene terephthalate-based resin, a polybutylene terephthalate-based resin, or a mixture thereof may be used. As the polyvinylchloride-based resin, for example, polyvinylidene chloride may be used. As the mixture of hydrocarbon, for example, hexatriacotane or paraffin may be used. As the polyamide-based resin, for example, nylon may be used. As the acrylate-based resin, for example, polybutyl (meth)acrylate may be used. As the epoxy-based resin, for example, a bisphenol-type resin such as a bisphenol A-type resin, a bisphenol F-type resin, a bisphenol S-type resin, and a hydration product thereof; a novolac-type resin such as a phenolnovolac-type resin or a cresolnovolac-type resin; a nitrogen-containing cyclic resin such as a triglycidylisocyanurate-type resin or a hydantoin-type resin; an alicyclic resin; an aliphatic resin; an aromatic resin such as a naphthalene-type resin or a biphenyl-type resin; a glycidyl-type resin such as a glycidylether-type resin, a glycidylamine-type resin, or a glycidylester-type resin; a dicyclo-type resin such as a dicyclopentadiene-type resin; an ester-type resin; an etherester-type resin; or a mixture thereof may be used. As the silicon-based resin, for example, polydimethylsiloxane may be used. In addition, as the fluorine-based resin, a polytrifluoroethylene resin, a polytetrafluoroethylene resin, a polychlorotrifluoroethylene resin, a polyhexafluoropropylene resin, a polyfluorinated vinylidene, a polyfluorinated vinyl, a polyfluorinated ethylenepropylene, or a mixture thereof may be used.

The listed resins may be grafted with, for example, maleic acid anhydride, copolymerized with another one of the listed resins or a monomer for preparing a resin, or modified by another compound. As an example of the compound, a carboxyl-terminal butadiene-acrylonitrile copolymer may be used.

In addition, the listed resins may include at least one functional group or site that can be cured by heat such as a glycidyl group, an isocyanate group, a hydroxyl group, a carboxyl group, or an amide group, or at least one functional group or site that can be cured by radiation of active energy beams such as an epoxide group, a cyclic ether group, a sulfide group, an acetal group, or a lactone group to exhibit adhesiveness after curing.

In one example, the curable resin may include a polyisobutene resin. The polyisobutene resin may have hydrophobicity, thereby exhibiting a low WVTR and low surface energy. Particularly, as the polyisobutene resin, for example, a homopolymer of an isobutylene monomer; or a copolymer of an isobutylene monomer and a different monomer that can be polymerized therewith may be used. Here, the monomer that can be polymerized with the isobutylene monomer may include, for example, 1-butene, 2-butene, isoprene, or butadiene.

The curable adhesive layer may further include a moisture absorbent as well as the curable resin. The term "moisture absorbent" may refer to a moisture-reactive absorbent which is a component capable of absorbing or removing moisture or vapor input from an external environment through a chemical reaction.

The moisture absorbent chemically reacts with vapor, moisture, or oxygen input to an inside of the adhesive layer to absorb moisture or vapor. A specific kind of the moisture absorbent is not particularly limited, and the moisture absorbent may be one or a mixture of at least two of a metal powder such as alumina, a metal oxide, a metal salt, and phosphorus pentoxide ($P_2O_5$).

Here, a specific example of the metal oxide may be phosphorus pentoxide ($P_2O_5$), lithium oxide ($Li_2O$), sodium oxide ($Na_2O$), barium oxide (BaO), calcium oxide (CaO), or magnesium oxide (MgO), the metal salt may be a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO_4)_2$) or magnesium perchlorate ($Mg(ClO_4)_2$), but the present invention is not limited thereto.

The metal oxides may be blended into the composition in a state in which the moisture absorbent is suitably processed. For example, depending on the kind of an organic electronic device to which the adhesive film is to be applied, the adhesive layer may be a thin film having a thickness of 30 μm or less, and in this case, it may be necessary to perform a grinding process on the moisture absorbent. To grind the moisture absorbent, a process with a 3-roll mill, bead mill, or ball mill may be used. In addition, when the adhesive film of the present invention is applied to a top-emissive organic electronic device, transmittance of the adhesive layer is very important, and thus it is necessary to decrease the size of the moisture absorbent. Therefore, to be used in such a use, the moisture absorbent is necessarily subjected to a grinding process.

The adhesive layer may include the moisture absorbent in an amount of 1 to 100 parts by weight relative to 100 parts by weight of the curable resin. When the moisture absorbent is included in the above range, a crack in the film caused by volume expansion caused by a reaction between the moisture absorbent and moisture may be prevented, physical or chemical damage may be prevented, and long-term reliability of the adhesive film may also be provided.

Unless particularly defined otherwise, the units "parts by weight" used herein refer to a weight ratio between components.

When the range of a content of the moisture absorbent is controlled as described above, a cured product may exhibit excellent moisture and vapor resistances, a thin film-type encapsulation structure may be formed, and an excellent moisture resistance may be exhibited.

The curable adhesive layer may further include a filler. The filler is a kind of physical moisture absorbent that may extend a traveling path of moisture or vapor that permeates into an encapsulation structure to inhibit the permeation of moisture or vapor, thereby maximizing a resistance to moisture and vapor due to a matrix structure of a curable resin and through interaction with the moisture absorbent. A specific kind of filler that can be used in the present invention may be, but is not limited to, one or a mixture of at least two selected from the group consisting of clay, talc, silica, zeolite, zirconia, titania, and montmorillonite.

In addition, to increase binding efficiency between the filler and an organic binder, a product whose surface is treated with an organic material may be used as the filler, or a coupling agent may be further added to the filler.

The curable adhesive layer may include the filler in an amount of 1 to 50 or 1 to 20 parts by weight relative to 100 parts by weight of the curable resin. As the content of the filler is controlled to 1 part by weight or more, a cured product having excellent moisture or vapor resistance and mechanical properties may be provided. In addition, as the content of the filler is controlled to 50 parts by weight or less, a cured product capable of being formed in a film type, and exhibiting excellent moisture resistance even when formed in a thin film, may be provided.

A specific kind of curing agent that can be used is not particularly limited, and may be suitably selected according to the curable resin used or the kind of a functional group included in the resin. For example, when an epoxy resin is used as the curable resin in the present invention, a general curing agent for an epoxy resin known in the art may be used as the curing agent, which may be, but is not limited to, one or a mixture of at least two of amine-based compounds, imidazole-based compounds, phenol-based compounds, phosphorus-based compounds, and acid anhydride-based compounds.

The curable adhesive layer may include the curing agent in an amount of 1 to 20 or 1 to 10 parts by weight relative to 100 parts by weight of the curable resin. However, the content is only an example of the present invention. That is, the content of the curing agent may be changed according to the kind and content of the curable resin or functional group, and a matrix structure or crosslinking density to be realized.

In addition, the kind of the initiator that can be used in the present invention, for example, a cationic photopolymerization initiator is not particularly limited, and a known cationic photopolymerization initiator such as an aromatic diazonium salt, an aromatic iodine aluminum salt, an aromatic sulfonium salt, or an iron-arene complex, and preferably, an aromatic sulfonium salt may be used, but the present invention is not limited thereto.

In this case, for example, a content of the initiator may be included in an amount of 0.01 to 10 or 0.1 to 3 parts by weight relative to 100 parts by weight of the curable resin. When the content of the cationic photopolymerization initiator is excessively low, curing may not be sufficiently performed, and when the content of the cationic photopolymerization initiator is excessively high, the content of the ionic material is increased after curing, thereby degrading durability of the adhesive, or degrading optical durability of the adhesive because of formation of a conjugate acid as the characteristic of the initiator. In addition, depending on a base, corrosion may occur, and in consideration of this, a suitable content range may be selected.

The curable adhesive layer may further include a high molecular weight resin. When the composition is molded in a film or sheet shape, the high molecular weight resin serves to improve moldability. In addition, the high molecular weight resin may serve as a high-temperature viscosity controller to control flowability in the process.

The kind of high molecular weight resin that can be used in the present invention is not particularly limited as long as the resin has a compatibility with another component such as the curable resin. A specific kind of the high molecular weight resin that can be used may be, but is not limited to, a resin having a weight average molecular weight of 20,000 or more, which is one or a mixture of at least two of a phenoxy resin, an acrylate resin, a high molecular weight epoxy resin, a ultra-high molecular weight epoxy resin, a rubber containing a high polarity functional group, and a reactive rubber containing a high polarity functional group, but the present invention is not limited thereto.

When the high molecular weight resin is included in the curable adhesive layer, the content is controlled according to a desired physical property, and is not particularly limited. For example, the high molecular weight resin may be included in an amount of approximately 200, 150, or 100 parts by weight or less relative to 100 parts by weight of the curable resin. As the content of the high molecular weight resin is controlled to 200 parts by weight or less, the compatibility of the resin with each component may be effectively maintained, and the resin may also serve as an adhesive.

The adhesive film may further include an additive such as an additional filler to enhance durability of the cured product, a coupling agent to enhance mechanical strength and adhesive strength, a plasticizer, a UV stabilizer, and an antioxidant without an influence on the effects of the present invention.

The curable adhesive layer of the adhesive film may have a single-layered structure, or a multi-layered structure having at least two adhesive layers. When the adhesive film includes multi-layered adhesive layers, more of the moisture absorbent may be contained in layers farther from the organic electronic device.

The structure of the adhesive film of the present invention is not particularly limited as long as the adhesive film includes the adhesive layer. For example, the adhesive film may have a structure including a base or releasing film (hereinafter, referred to as a "first film"); and the adhesive layer formed on the base or releasing film.

The adhesive film may further include a base or releasing film (hereinafter, referred to as a "second film"), which is formed on the adhesive layer.

A specific kind of the first film that can be used in the present invention is not particularly limited. In the present invention, as the first film, for example, a general polymer film in the art may be used. In the present invention, for example, as the base or releasing film, a polyethyleneterephthalate film, a polytetrafluoroethylene film, a polyethylene film, a polypropylene film, a polybutene film, a polybutadiene film, a vinylchloride copolymer film, a polyurethane film, an ethylene-vinyl acetate film, an ethylene-propylene copolymer film, an ethylene-acrylic acid ethyl copolymer film, an ethylene-acrylic acid methyl copolymer film, or a polyimide film may be used. In addition, suitable releasing treatment may be performed on one or both surfaces of the base or releasing film of the present invention. An example of a releasing agent used in the releasing treatment of the base film may be an alkyd-, silicon-, fluorine-, unsaturated ester-, polyolefin-, or wax-based agent, and among these, in terms of heat resistance, an alkyd-, silicon-, or fluorine-based releasing agent is preferably used, but the present invention is not limited thereto.

In addition, the kind of the second film (hereinafter, also referred to as "cover film") that can be used in the present invention is not particularly limited, either. For example, in the present invention, as the second film, in the above-described range of the first film, one that is the same as or different from the first film may be used. In addition, in the present invention, suitable releasing treatment may also be performed on the second film.

A thickness of the base or releasing film as described above (the first film) is not particularly limited, and may be suitably selected according to application. For example, in the present invention, the thickness of the first film may be approximately 10 to 500 μm or 20 to 200 μm. When the thickness of the film is controlled within the above range, transformation of the base film may be prevented, and economic feasibility may be increased.

A thickness of the second film is not particularly limited, either. In the present invention, for example, the thickness of the second film may be set to be the same as that of the first film. In addition, in consideration of processability, the thickness of the second film may be set to be relatively smaller than that of the first film.

A thickness of the adhesive layer included in the adhesive film is not particularly limited, and in consideration of a use of the film, the thickness of the adhesive layer may be suitably selected according to the following conditions.

In exemplary embodiments of the present invention, a method of manufacturing the adhesive film described above is not particularly limited. For example, the adhesive film may be manufactured by coating a coating solution including a composition of the above-described adhesive layer on a base or releasing film (first operation); and drying the coating solution coated in the first operation (second operation).

In the method of manufacturing the adhesive film according to the present invention, compressing a base or releasing film on the coating solution dried in the second operation (third operation) may be further included.

The first operation is to prepare a coating solution by dissolving or dispersing a composition of the above-described adhesive layer in a suitable solvent. In this operation, a content of the epoxy resin included in the coating solution may be suitably controlled according to desired moisture resistance and film moldability.

The kind of the solvent used in the preparation of the coating solution is not particularly limited. However, when a drying time of the solvent is excessively long, or drying of the solvent at a high temperature is necessary, problems in terms of workability or durability of the adhesive film may occur, and thus it is preferable that a solvent having a volatile temperature of 100° C. or less be used. In addition, in consideration of the film moldability, a small amount of a solvent having a volatile temperature beyond the above range may be mixed. As an example of the solvent that can be used in exemplary embodiments of the present invention, one or a mixture of at least two of methylethylketone (MEK), acetone, toluene, dimethylformamide (DMF), methylcellosolve (MCS), tetrahydrofuran (THF), and N-methylpyrollidone (NMP) can be used, but the present invention is not limited thereto.

In the first operation, a method of coating the coating solution on the base or releasing film is not particularly limited, and a known method such as knife coating, roll coating, spray coating, gravure coating, curtain coating, comma coating, or lip coating may be used without limitation.

The second operation is to form an adhesive layer by drying the coating solution coated in the first operation. That is, in the second operation, the adhesive layer may be formed by drying and removing a solvent by heating the coating solution coated on the film. Here, a drying condition is not particularly limited, and the drying may be performed at 70 to 200° C. for 1 to 10 minutes.

In the method of manufacturing the adhesive film, following the second operation, compressing another base or releasing film on the adhesive layer formed on the film may be further included as the third operation.

The third operation described above may be performed by compressing another releasing or base film (a cover film or a second film) on the dried adhesive layer by a hot roll laminating or pressing process, after coating the adhesive layer. Here, the third operation may be performed by hot roll laminating in terms of probability and efficiency of a continuous process, and here, the process may be performed at approximately 10 to 100° C., and a pressure of approximately 0.1 to 10 kgf/cm$^2$.

Another exemplary embodiment of the present invention provides an organic electronic device encapsulation product including a substrate; an organic electronic device formed on the substrate; and the above-described adhesive film encapsulating the organic electronic device, in which the adhesive film covers an entire surface of the organic electronic device.

The organic electronic device encapsulation product may further include a protective layer to protect the organic electronic device between the adhesive film and the organic electronic device.

The organic electronic device encapsulation product may further include an encapsulation substrate above the adhesive film, and here, the adhesive film serves to adhere the encapsulation substrate to the substrate. In one exemplary embodiment of the present invention, the organic electronic device may be an organic light emitting diode (OLED).

The organic electronic device encapsulation product has advantages of a simple process and a decrease in production costs. The organic electronic device encapsulation product can also be used regardless of a method of designing the organic electronic device, and provide excellent mechanical durability to the organic electronic device.

Still another exemplary embodiment of the present invention provides a method of encapsulating an organic electronic device, which includes applying an adhesive layer of the above-described adhesive film to a substrate on which an organic electronic device is formed to cover an entire surface of the organic electronic device, and curing the adhesive layer.

The application of the adhesive film to the organic electronic device may be performed by hot-roll laminating, hot pressing, or vacuum compressing the adhesive film, but the present invention is not particularly limited.

The application of the adhesive film to the organic electronic device may be performed at 50 to 90° C., and the curing operation may be performed by heating in a range of 70 to 110° C., or radiating UV rays.

In addition, the method may further include attaching the adhesive film to face an additional encapsulation material such as glass or metal.

The method of encapsulating an organic electronic device includes forming a transparent electrode on a substrate such as glass or a polymer film by a method such as vacuum deposition or sputtering, and forming an organic material layer on the transparent electrode. The organic material layer may include a hole injection layer, a hole transport layer, an emitting layer, an electron injection layer, and/or an electron transport layer. Subsequently, a second electrode is further formed on the organic material layer. Afterward, the above-described adhesive film is applied to a top surface of the organic electronic device on the substrate to cover an entire surface of the organic electronic device. Here, a method of applying the adhesive film is not particularly limited, and may be a method of heating or compressing a cover substrate (e.g., glass or a polymer film) to which the above-described adhesive layer of the adhesive film is previously transfer-printed to a top surface of the organic electronic device formed on the substrate. In this operation, for example, when the adhesive film is transfer-printed on the cover substrate, the above-described adhesive film may be transfer-printed on the cover substrate using a vacuum press or vacuum laminator by applying heat after a base or releasing film formed on the film is peeled off. In this operation, when a curing reaction of the adhesive film is performed in a certain range or more, cohesive strength or adhesive strength of the adhesive film may be decreased, thereby preferably controlling a process temperature and a process time to approximately 100° C. or less and approximately within 5 minutes, respectively. Similarly, even when the cover substrate on which the adhesive film is transfer-printed is heat-compressed to the organic electronic device, a vacuum press or vacuum laminator may be used. A temperature condition for this operation may be set as described above, and a process time may be within 10 minutes.

In addition, an additional curing process to the adhesive film to which the organic electronic device is compressed may be performed, and such a curing process (main curing) may be performed, for example, in a heating chamber or UV chamber. A curing condition in the main curing may be suitably selected in consideration of stability of the organic electronic device.

However, the above-described forming process is merely an example for encapsulating the organic electronic device, and thus a sequence of or condition for the process may be freely changed. For example, the sequence of the transfer-printing and compressing processes may be changed in such a manner that the above-described adhesive film is transfer-printed to the organic electronic device on the substrate, followed by compressing the cover substrate. In addition, after the protective layer is formed on the organic electronic device, the adhesive film may be applied and then cured without the cover substrate.

Hereinafter, the present invention will be described in further detail with reference to Examples according to the present invention and Comparative Examples not according to the present invention, but the scope of the present invention is not limited to the following Examples.

Examples 1 to 3

1. Preparation of Adhesive Solution

A moisture absorbent solution was prepared by putting 70 g of CaO (Aldrich) as a moisture absorbent into methylethylketone at a concentration of 30 wt %, and milled by a ball-mill process for 24 hours. In addition, separately, 200 g of a silane-modified epoxy resin (KSR-177, Kukdo Chemical Co., Ltd.) and 150 g of a phenoxy resin (YP-50, Tohto Kasei Co., Ltd.) were put into a reaction vessel at room temperature, and diluted with methylethylketone. Afterward, an inside of the reaction vessel was substituted with nitrogen, and the prepared solution was homogenized. The moisture absorbent solution prepared beforehand was put into the homogenized solution, 4 g of an imidazole (Shikoku Chemicals Co., Ltd.) was added as a curing agent, and the resulting solution was stirred at a high speed for 1 hour, thereby preparing an adhesive solution.

2. Manufacture of Adhesive Film

An adhesive layer having a thickness of 15 μm was formed by coating the above-prepared adhesive solution to a releasing surface of a releasing PET using a comma coater, and drying the resulting surface with a drier at 130° C. for 3 minutes, and the releasing PET was further compressed to a top surface of the adhesive layer.

3. Storage of Adhesive Film

The above-prepared adhesive film was kept in a freezer at a temperature of 4° C. for 2, 4, and 8 weeks.

Comparative Examples 1 to 3

Adhesive films were prepared by the same methods as described in Examples 1 to 3, except that a storage temperature was changed to 20° C. in the storage of the adhesive film in Example 1.

Experimental Example 1: Measurement of Dimensional Tolerance

To investigate dimensional tolerance and edge angular tolerance of the adhesive films in Examples 1 to 3 and Comparative Examples 1 to 3, particularly, the adhesive films in Examples 1 to 3 and Comparative Examples 1 to 3 were cut to a size of 1218 mm×692 mm (55 inches) before storage. Right after the cutting operation, lengths of longer and shorter sides and angles of respective edges were measured. Afterward, as described in Examples 1 to 3, lengths of longer and shorter sides and angles of respective edges of the adhesive films stored for 2, 4, and 8 weeks, respectively, at 4° C. were measured. In addition, as described in Comparative Examples 1 to 3, lengths of longer and shorter sides and angles of respective edges of the adhesive films stored for 2, 4, and 8 weeks, respectively, at 20° C. were measured.

The lengths of the longer and shorter sides and the angles of the respective edges right after the cutting and the lengths of the longer and shorter sides and differences in the angles of the edges after the storage are shown in Tables 1 and 2.

TABLE 1

| Category | Example 1 | Example 2 | Example 3 |
|---|---|---|---|
| Dimensional tolerance (μm) | −100 | −120 | −60 |
| Edge angular tolerance (degrees) | −0.01 | 0 | +0.01 |

| | Comparative Example 1 | Comparative Example 2 | Comparative Example 3 |
|---|---|---|---|
| Dimensional tolerance (μm) | −880 | −950 | −820 |
| Edge angular tolerance (degrees) | −0.05 | −0.06 | −0.05 |

As seen from above, it can be confirmed that when the adhesive films in Examples 1 to 3 according to exemplary embodiments of the present invention were stored at 4° C., the dimensional tolerance was less than ±800 μm, and the edge angular tolerance was less than ±0.05 degrees. However, like the conventional adhesive film, as the storage time for storing the film at room temperature of 20° C. is increased, it can be confirmed that the dimensional tolerance and the edge angular tolerance were high.

While the invention has been shown and described with reference to certain exemplary embodiments thereof, it will be understood by those skilled in the art that various changes in form and details may be made therein without departing from the scope of the invention as defined by the appended claims.

What is claimed is:

1. An adhesive film encapsulating an organic electronic device OED, comprising:
a curable adhesive layer comprising a curable resin,
wherein a dimensional tolerance (d) or edge angular tolerance (x) of the adhesive film satisfies Equation 1 or 2:

$$d=|d_f-d_i|<800 \text{ μm} \quad \text{[Equation 1]}$$

$$x=|x_f-x_i|<0.05 \text{ degrees} \quad \text{[Equation 2]}$$

where $d_i$ is a length of a longer side or shorter side of the adhesive film at an optional i point, $d_f$ is a length of a longer side or shorter side of the adhesive film at a point of 2 weeks or more after the optional i point, $x_i$ is an angle of an edge of the adhesive film at an optional i point, and $x_f$ is an angle of an edge of the adhesive film at a point of 2 weeks or more after the optional i point, and
wherein the adhesive film is stored at a temperature of −10° C. to 10° C.

2. The adhesive film according to claim 1, wherein the curable adhesive layer has a viscosity at room temperature of $10^6$ dyne/cm$^2$ or more.

3. The adhesive film according to claim 1, wherein the curable resin has a water vapor transmission rate (WVTR) in a cured state of 50 g/m$^2$·day or less.

4. The adhesive film according to claim 1, wherein the curable resin is a heat-curable resin, a photocurable resin, or a dual-curable resin.

5. The adhesive film according to claim 1, wherein the curable resin comprises at least one curable functional group selected from the group consisting of a glycidyl group, an isocyanate group, a hydroxyl group, a carboxyl group, an amide group, an epoxide group, a cyclic ether group, a sulfide group, an acetal group, and a lactone group.

6. The adhesive film according to claim 1, wherein the curable resin is an epoxy resin comprising a cyclic structure in a molecular structure.

7. The adhesive film according to claim 1, wherein the curable resin is a silane-modified epoxy resin.

8. The adhesive film according to claim 1, wherein the adhesive layer further comprises a moisture absorbent.

9. The adhesive film according to claim 8, wherein the moisture absorbent is alumina, a metal oxide, a metal salt, or phosphorus pentoxide.

10. The adhesive film according to claim 9, wherein the moisture absorbent is at least one selected from the group consisting of $P_2O_5$, $Li_2O$, $Na_2O$, BaO, CaO, MgO, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $CaCl_2$, $MgCl_2$, $SrCl_2$, $YCl_3$, $CuCl_2$, CsF, $TaF_5$, $NbF_5$, LiBr, $CaBr_2$, $CeBr_3$, $SeBr_4$, $VBr_3$, $MgBr_2$, $BaI_2$, $MgI_2$, $Ba(ClO_4)_2$, and $Mg(ClO_4)_2$.

11. The adhesive film according to claim 8, wherein the adhesive layer comprises the moisture absorbent in an amount of 1 to 100 parts by weight relative to 100 parts by weight of the curable resin.

12. The adhesive film according to claim 1, wherein the adhesive layer further comprises a filler.

13. The adhesive film according to claim 12, wherein the filler is at least one selected from the group consisting of clay, talc, silica, zeolite, zirconia, titania, and montmorillonite.

14. The adhesive film according to claim 12, wherein the adhesive layer comprises the filler in an amount of 1 to 50 parts by weight relative to 100 parts by weight of the curable resin.

15. The adhesive film according to claim 1, wherein the adhesive layer further comprises a curing agent.

16. The adhesive film according to claim 15, wherein the curing agent is an amine-based compound, imidazole-based compound, phenol-based compound, phosphorus-based compound, or acid anhydride-based compound.

17. The adhesive film according to claim 15, wherein the adhesive layer comprises the curing agent in an amount of 1 to 10 parts by weight relative to 100 parts by weight of the curable resin.

18. The adhesive film according to claim 1, wherein the adhesive layer further comprises an initiator.

19. The adhesive film according to claim 1, wherein the adhesive layer further comprises a high molecular weight resin.

20. The adhesive film according to claim 1, wherein the curable adhesive layer has a single-layered structure or a multi-layered structure having at least two layers or more.

21. An organic electronic device encapsulation product, comprising:
a substrate;
an organic electronic device formed on the substrate; and
an adhesive film according to claim 1 encapsulating the organic electronic device,
wherein the adhesive film covers an entire surface of the organic electronic device.

22. The organic electronic device encapsulation product according to claim 21, wherein the organic electronic device is an organic light emitting diode.

23. A method of encapsulating an organic electronic device OED, the method comprising:
providing an adhesive film which comprises a curable adhesive layer comprising a curable resin,
storing the adhesive film at a temperature of −10° C. to 10° C.
controlling a dimensional tolerance (d) and edge angular tolerance (x) of the adhesive film to satisfy Equation 1 or 2;
applying the adhesive film, after controlling a dimensional tolerance (d) and edge angular tolerance (x) to satisfy Equation 1 or 2, to a substrate on which the organic electronic device OED is formed to cover an entire surface of the organic electronic device OED:

$$d=|df-di|<800 \text{ μm} \quad \text{[Equation 1]}$$

$$x=|xf-xi|<0.05 \text{ degrees} \quad \text{[Equation 2]}$$

where $d_i$ is a length of a longer side or shorter side of the adhesive film at an optional i point, $d_f$ is a length of a longer side or shorter side of the adhesive film at a point of 2 weeks or more after the optional i point, $x_i$ is an angle of an edge of the adhesive film at an optional i point, and $x_f$ is an angle of an edge of the adhesive film at a point of 2 weeks or more after the optional i point.

* * * * *